(12) United States Patent
Ishimi

(10) Patent No.: US 9,157,959 B2
(45) Date of Patent: Oct. 13, 2015

(54) SEMICONDUCTOR DEVICE

(71) Applicant: RENESAS ELECTRONICS CORPORATION

(72) Inventor: Koichi Ishimi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 257 days.

(21) Appl. No.: 13/657,227

(22) Filed: Oct. 22, 2012

(65) Prior Publication Data

US 2013/0103988 A1    Apr. 25, 2013

(30) Foreign Application Priority Data

Oct. 21, 2011   (JP) ................. 2011-231778

(51) Int. Cl.
*G06F 11/00* (2006.01)
*G01R 31/3185* (2006.01)
*G06F 11/30* (2006.01)
*G06F 11/34* (2006.01)
*G06F 11/24* (2006.01)
*G06F 11/07* (2006.01)

(52) U.S. Cl.
CPC ...... *G01R 31/318505* (2013.01); *G06F 11/008* (2013.01); *G06F 11/076* (2013.01); *G06F 11/0724* (2013.01); *G06F 11/24* (2013.01); *G06F 11/3024* (2013.01); *G06F 11/3419* (2013.01)

(58) Field of Classification Search
CPC . G06F 11/2236; G06F 11/24; G06F 11/3024; G06F 11/3419
USPC ................... 714/30, 33, 34, 39, 55
See application file for complete search history.

(56) References Cited

U.S. PATENT DOCUMENTS

| | | | |
|---|---|---|---|
| 7,005,871 B1* | 2/2006 | Davies et al. | 324/750.3 |
| 7,129,800 B2* | 10/2006 | Gauthier et al. | 331/175 |
| 7,827,018 B2* | 11/2010 | Adams et al. | 703/14 |
| 7,949,893 B1* | 5/2011 | Knaus et al. | 714/4.1 |
| 8,094,706 B2 | 1/2012 | Kim et al. | |
| 8,166,284 B2 | 4/2012 | Takada | |
| 8,674,774 B2 | 3/2014 | Saneyoshi et al. | |
| 2007/0033431 A1* | 2/2007 | Pecone et al. | 714/6 |

(Continued)

FOREIGN PATENT DOCUMENTS

| | | |
|---|---|---|
| JP | 2004-296841 A | 10/2004 |
| JP | 2008-180635 A | 8/2008 |

(Continued)

OTHER PUBLICATIONS

Notification of Reasons for Refusal Japanese Patent Application No. 2011-231778 dated May 12, 2015 with full English translation.

*Primary Examiner* — Joshua Lohn
(74) *Attorney, Agent, or Firm* — McDermott Will & Emery LLP

(57) ABSTRACT

The disclosed invention provides a semiconductor device that enables early discovery of a sign of aged deterioration that occurs locally. An LSI has a plurality of modules and a delay monitor cluster including a plurality of delay monitors. Each delay monitor includes a ring oscillator having a plurality of gate elements. Each delay monitor measures a delay time of the gate elements. A CPU #0 determines if a module proximate to a delay monitor suffers from aged deterioration, based on the delay time measured by the delay monitor.

14 Claims, 19 Drawing Sheets

(56) References Cited

U.S. PATENT DOCUMENTS

| | | | |
|---|---|---|---|
| 2008/0253437 A1* | 10/2008 | Kim et al. | 375/228 |
| 2009/0319202 A1* | 12/2009 | Gebara et al. | 702/42 |
| 2011/0090015 A1 | 4/2011 | Sumita et al. | |
| 2011/0101990 A1* | 5/2011 | Noorlag et al. | 324/537 |
| 2012/0216071 A1* | 8/2012 | Niu | 714/4.11 |
| 2012/0249170 A1* | 10/2012 | Baumann et al. | 324/750.3 |
| 2013/0047166 A1* | 2/2013 | Penzes et al. | 718/105 |
| 2013/0117589 A1* | 5/2013 | Satyamoorthy et al. | 713/320 |

FOREIGN PATENT DOCUMENTS

| | | |
|---|---|---|
| JP | 2009-251997 A | 10/2009 |
| JP | 2010-087275 A | 4/2010 |
| JP | 2010-510592 A | 4/2010 |
| JP | 2010-524101 A | 7/2010 |
| JP | 2010-287860 A | 12/2010 |
| WO | 2008064213 A1 | 5/2008 |
| WO | 2011027553 A1 | 3/2011 |

* cited by examiner

FIG. 8

| Cdc (Hex) | VOLTAGE |
|---|---|
| 0x000 TO 0x499 | 1.5 V |
| 0x500 TO 0x599 | 1.49 V |
| 0x600 TO 0x699 | 1.48 V |
| 0x700 TO 0x799 | 1.47 V |
| 0x800 TO 0x899 | 1.46 V |
| 0x900 TO 0x999 | 1.45 V |
| 0xa00 TO 0xfff | 1.44 V |

FIG. 10

| Cdc (Hex) | FREQUENCY DIVISION RATIO |
|---|---|
| 0x000 TO 0x499 | NO DIVISION |
| 0x500 TO 0x599 | DIVIDE BY 1.5 |
| 0x600 TO 0x699 | DIVIDE BY 2 |
| 0x700 TO 0x799 | DIVIDE BY 3 |
| 0x800 TO 0x899 | DIVIDE BY 4 |
| 0x900 TO 0x999 | DIVIDE BY 5 |
| 0xa00 TO 0xfff | DIVIDE BY 6 |

SEMICONDUCTOR DEVICE

CROSS-REFERENCE TO RELATED APPLICATIONS

The disclosure of Japanese Patent Application No. 2011-231778 filed on Oct. 21, 2011 including the specification, drawings and abstract is incorporated herein by reference in its entirety.

BACKGROUND

The present invention relates to a semiconductor device.

A method for detecting a deterioration of a device such as an integrated circuit is known. For instance, a method disclosed in Patent Document 1 includes periodically determining a maximum operating frequency of a digital system and generating a warning signal that indicates a decrease in the reliability of the digital system if at least one of the following cases is true: (i) the measured or estimated maximum operating frequency of the digital system is less than a warning threshold operating frequency for the digital system and the warning threshold operating frequency is equal to or more than a minimum operating frequency specified for the digital system by its manufacturer; and (ii) a rate of change obtained from a difference between measured maximum operating frequencies of the digital system exceeds a threshold of an allowable rate of change for the digital system.

RELATED ART DOCUMENT

Patent Document
[Patent Document 1] Published Japanese Translation of PCT International Publication for Patent Application No. 2010-524101

SUMMARY

A deterioration detection apparatus of related art, as disclosed in Patent Document 1, issues an alarm upon detecting a sign of deterioration, so that the system or LSI in question should be repaired or replaced. If it is found beforehand that a system is likely to fail, parts procurement and maintenance scheduling can be coordinated. Thus, there is a merit that a replacement work can be carried forward smoothly.

However, the deterioration detection apparatus of related art has a problem as will be discussed below. In a case that a plurality of die chips are mounted within a single package, parameters regarding reliability differ from one die chip to another, since the respective dies are manufactured through different manufacturing processes. That is, because the die chips have different failure ratios and lifetimes, even if a die chip deteriorates, it is not always true that another die chip deteriorates likewise. Moreover, in a large-scale system LSI in which analog circuits, memories, high speed circuits, and low speed circuits are mixed, even in a same die, the degree of microfabrication differs from one spot to another. This leads to locally different failure ratios and lifetimes in a die. Even with the same degree of microfabrication, different spots in a die have different voltages, current densities, and temperatures which are largely related to deterioration. Thus, even if one portion of a die deteriorates, it is not always true that another portion deteriorates likewise. As above, despite that deterioration does not occur evenly across one semiconductor chip, the related art apparatus detects a deterioration of a chip as a whole and replaces the whole chip, thereby resulting in wastefulness.

Therefore, an object of the present invention is to provide a semiconductor device that enables early discovery of a sign of aged deterioration that occurs locally.

A semiconductor device according to an embodiment of the present invention includes a plurality of modules and a plurality of delay monitors. Each delay monitor includes a ring oscillator having a plurality of gate elements and measures a delay time of the gate elements. This semiconductor device also includes a control unit that determines if a module proximate to a delay monitor suffers from aged deterioration, based on the delay time measured by the delay monitor.

According to an embodiment of the present invention, a semiconductor device that enables early discovery of a sign of aged deterioration that occurs locally is provided.

BRIEF DESCRIPTION OF THE DRAWINGS

FIG. 8 exemplifies a table for control of power supply voltage.

FIG. 10 exemplifies a table for control of frequency.

DETAILED DESCRIPTION

Embodiments of the present invention will be described below with reference to the drawings.

First Embodiment

Figure 1:
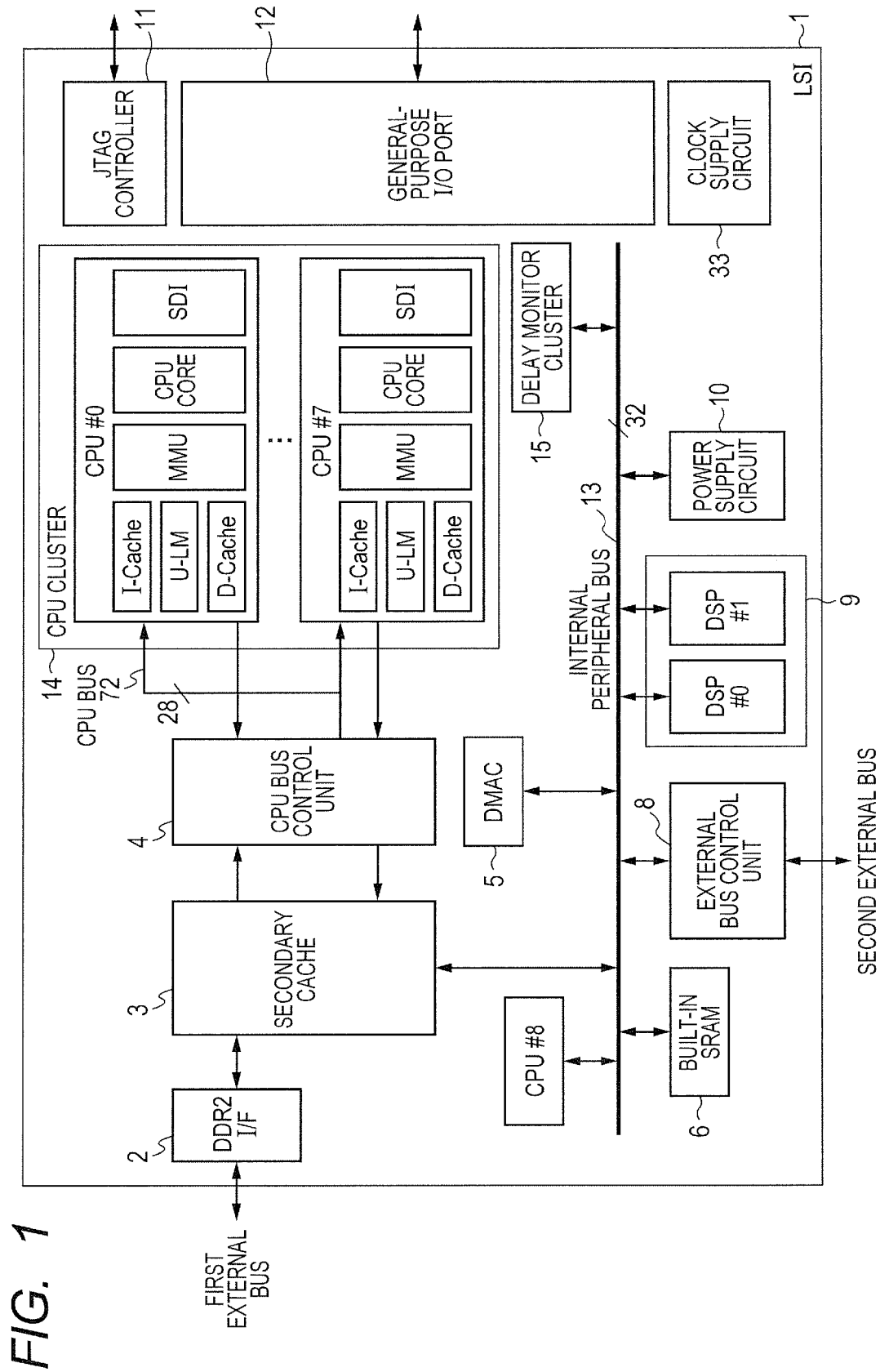
FIG. 1 is a diagram depicting a configuration of an LSI according to an embodiment described herein.

FIG. 1 is a diagram depicting a configuration of an LSI according to an embodiment described herein.

This LSI 1 is configured with multiple processors. This LSI 1 has a CPU (Central Processing Unit) cluster 14. The CPU cluster 14 includes a plurality of processors, CPUs #0 to #8. Each of the CPUs #0 to #8 has primary caches (I-cache, D-cache), a CPU core, an internal memory (U-LM), an MMU (memory management unit), and an SDI (debugger) within it.

The CPUs #0 to #7 are coupled to a CPU bus 72 and the CPU bus 72 is coupled to a secondary cache 3 via a CPU bus control unit 4. The secondary cache 3, a CPU #8, and a delay monitor cluster 15 are coupled to an internal peripheral bus 13. Further, the secondary cache is coupled to a first external bus via a DDR2 I/F 2.

Among the CPUs #0 to #8, the CPU #8 is assumed to execute a program that determines if aged deterioration occurs in the LSI 1 and implements control, based on a result of the determination, which will be described in the present embodiment. However, it is also possible for any of the CPUs #0 to #7 to execute a program that determines if aged deterioration occurs in the LSI 1 and implements control, based on a result of the determination, which will be described in the present embodiment.

This LSI 1 includes a DSP (Digital Signal Processor) cluster 9, a DMAC (Direct Memory Access Controller) 5, an external bus control unit 8, a power supply circuit 10, a built-in SRAM (Static Random Access Memory) 6, a JTAG (Joint Test Action Group) controller 11, a general-purpose I/O port 12, a clock supply circuit 33, and a power supply circuit 10.

DSP #0 and DSP #1 included in the DSP cluster 9 execute predefined computations specialized for image processing and others.

Figure 2:
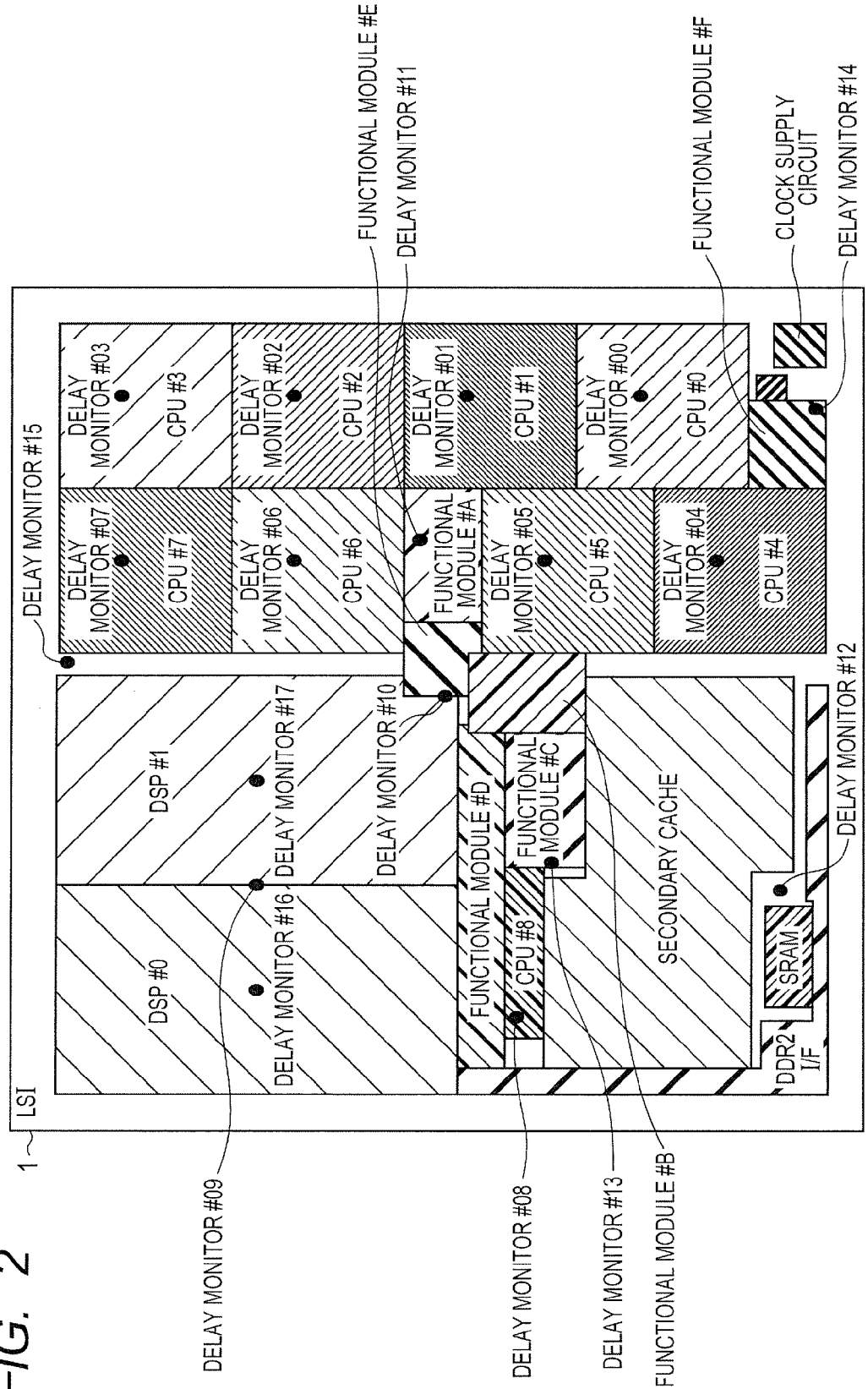
FIG. 2 is a diagram depicting a layout of the LSI of FIG. 1.

(Layout) FIG. 2 is a diagram depicting a layout of the LSI of FIG. 1.

As shown in FIG. 2, CPU #0, CPU #1, CPU #2, CPU #3, CPU #4, CPU #5, CPU #6, CPU #7, CPU #8, DSP #0, DSP #1, secondary cache 3, DDR2 I/F 2, built-in SRAM 6, clock supply circuit 33, functional module A, functional module B, functional module C, functional module D, functional module E, and functional module F correspond to single modules, respectively. The CPU bus control unit 4, DMAC 5, external bus control unit 8, power supply circuit 10, JTAG controller 11, general-purpose I/O port 12 in FIG. 1 belong to any of the functional modules #A to #F.

Also, delay monitors #00 to #16 are disposed within the LSI 1. These delay monitors #00 to #16 are small and consume low power. The delay monitors #00 to #16 are of exactly the same shape in the layout.

Each delay monitor is associated with one module and disposed proximate to (inside) the module assigned to it. For example, delay monitors #00 to #08 are associated with CPUs #0 to #8 and disposed proximate to the CPUs, respectively.

A delay monitor and a module associated with the delay module are provided with a common power supply or same clock frequency or both power supply and clock are common for them. Each delay monitor is disposed proximate to a module assigned to it so that a temperature condition and a process variation for the delay monitor approximate to those for the associated module. Therefore, if a delay value measured by a delay monitor has increased due to aged deterioration, it can be determined that the module associated with and disposed proximate to the delay monitor also suffers from aged deterioration.

For each of the above-mentioned single modules, namely, CPU #0, CPU #1, CPU #2, CPU #3, CPU #4, CPU #5, CPU #6, CPU #7, CPU #8, DSP #0, DSP #1, secondary cache, DDR2 I/F, SRAM, clock supply circuit, functional module A, functional module B, functional module C, functional module D, functional module E, and functional module F, its operating frequency can be controlled individually.

For CPU #0, CPU #1, CPU #2, CPU #3, CPU #4, CPU #5, CPU #6, CPU #7, CPU #8, DSP #0, DSP #1, secondary cache, DDR2 I/F, SRAM, clock supply circuit, functional module A, functional module F, and a set of functional modules B, C, D, and E, a voltage supplied thereto can be controlled individually.

(Delay monitor) Due to aged deterioration, a threshold value of a transistor changes, a drain current of a transistor decreases, and wires thin down in wirings and vias. Consequently, as aged deterioration progresses, a gate delay in an inverter chain gradually increases. A delay monitor of the present embodiment utilizes this characteristic.

Figure 3:
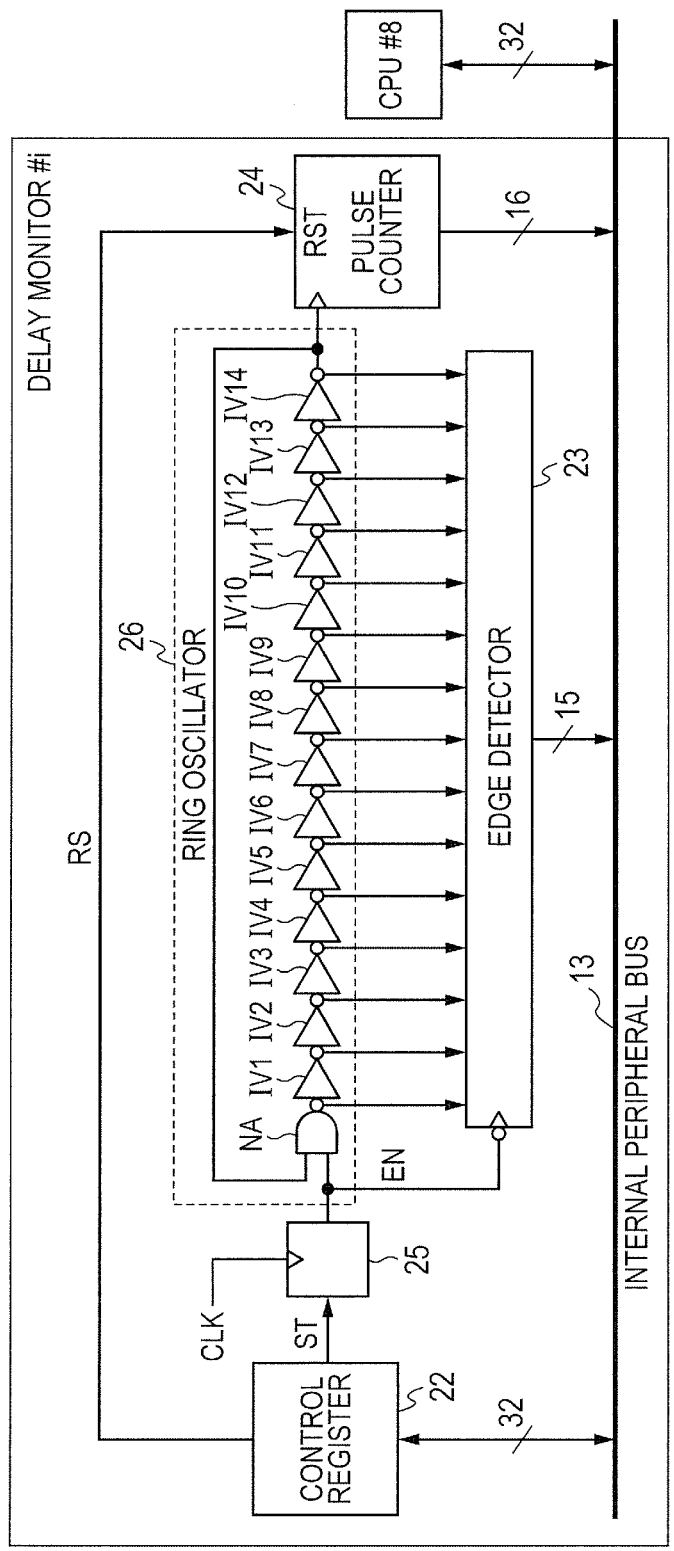
FIG. 3 is a diagram depicting a configuration of a delay monitor #i (i=any number from 00 to 16) of a first embodiment.

FIG. 3 is a diagram depicting a configuration of a delay monitor #i (i=any number from 00 to 16) of the first embodiment.

Referring to FIG. 3, the delay monitor #i includes a control register 22, a flip-flop 25, a ring oscillator 26, a pulse counter 24, and an edge detector 23.

The pulse counter 24, edge detector 23, CPU #8, and control register 22 are coupled to each other by the internal peripheral bus 13.

A signal from the CPU is input to the control register 22 through the internal peripheral bus 13. A reference clock CLK is further input to the control register 22. As the reference clock CLK, for example, a clock for the CPU #8, a clock for the internal peripheral bus 13, or a clock dedicated to the delay monitor, among others, may be used.

When starting up the delay monitor #i, a "1" is written to a measurement start bit in the control register under control of the CPU #8. When the measurement start bit has been set to "1" in the control register, a reset signal RS is output to the pulse counter 24.

Upon elapse of a given time after outputting the reset signal RS, the control register 22 outputs a measurement start signal ST to the flip-flop 25.

To the flip-flop 25, the reference clock CLK and the measurement start signal ST are input. When the measurement start signal ST has been input to the flip-flop 25, the flip-flop 25 outputs an oscillator enable signal EN to enable oscillation to the ring oscillator 26 and the edge detector 23 during one cycle Tc of the reference clock CLK.

The ring oscillator 26 has a NAND element NA, a plurality of stages of gate elements IV1 to IV14, and a first signal line and outputs an oscillation signal as long as the oscillator enable signal EN to enable oscillation is input to the first signal line.

The NAND element has two terminals. One terminal of the NAND element is an enable terminal to which the first signal line is coupled. By the above operation of the flip-flop 25, the oscillator enable signal EN is input to the first signal line during one cycle of the reference clock CLK. Thus, the oscillator enable signal EN is input to the enable terminal coupled to the first signal line. To the other terminal of the NAND element, a signal that is output from an inverter element located in the final stage.

The pulse counter 24 counts the number of oscillations of the oscillation signal output by the ring oscillator 26; in other words, it counts the number of output pulses Cdc of the ring oscillator 26. This count value is output, for example, in units of 16 bits. To the pulse counter 24, a reset signal RS from the control register 22 is input. When the reset signal RS has been input to the pulse counter 24, the pulse counter 24 resets the number of output pulses so far held in it.

The edge detector 23 detects the outputs of gate elements in each stage of the ring oscillator 26 at timing when the oscillator enable signal EN terminates. More specifically, the edge detector 23 detects the number of stages of gate elements (hereinafter referred to as the number of gate stages) Cdf across which the edges of the oscillator enable signal EN have propagated at the above timing. Cdf corresponds to the number of gate stages from the enable terminal, if the count of the edges of the oscillator enable signal EN passed through the ring oscillator 26 is even. On the other hand, if the count of the edges of the oscillator enable signal EN passed through the ring oscillator 26 is odd, Cdf is the number of gate stages from the enable terminal plus the number of all gate stages. Hence, Cdf assumes a value from 0 to 29. A result of this detection is output, for example, in 15 bits.

The CPU #8 is coupled to the pulse counter 24 and the edge detector 23 via the internal peripheral bus 13. The CPU #8 calculates predefined values regarding a delay by the gate elements, based on the outputs of the edge detector 23 and the pulse counter 24 within the delay monitor #i.

In the present embodiment, from the count value Cdc output by the pulse counter 24 and the detection result Cdf by the edge detector 23, the CPU #8 calculates the number of stages of gate elements of the ring oscillator 26 across which the edges of the oscillator enable signal EN can propagate during a period when the oscillator enable signal is input to the first signal line (hereinafter referred to as the number of stages across which the EN signal edges can propagate) Cd and an average delay time per gate element stage Td, according to equations (A1) and (A2).

$Cd = Cdc \times N \times 2 + Cdf \ldots (A1)$, $Td = Tc/Cd \ldots (A2)$, where Tc is the cycle time of the reference clock CLK and N is the number of stages of the gate elements of the ring oscillator 26. In the present embodiment, the average delay time per gate element stage Td is used as a delay value to determine if aged deterioration occurs.

Figure 4:
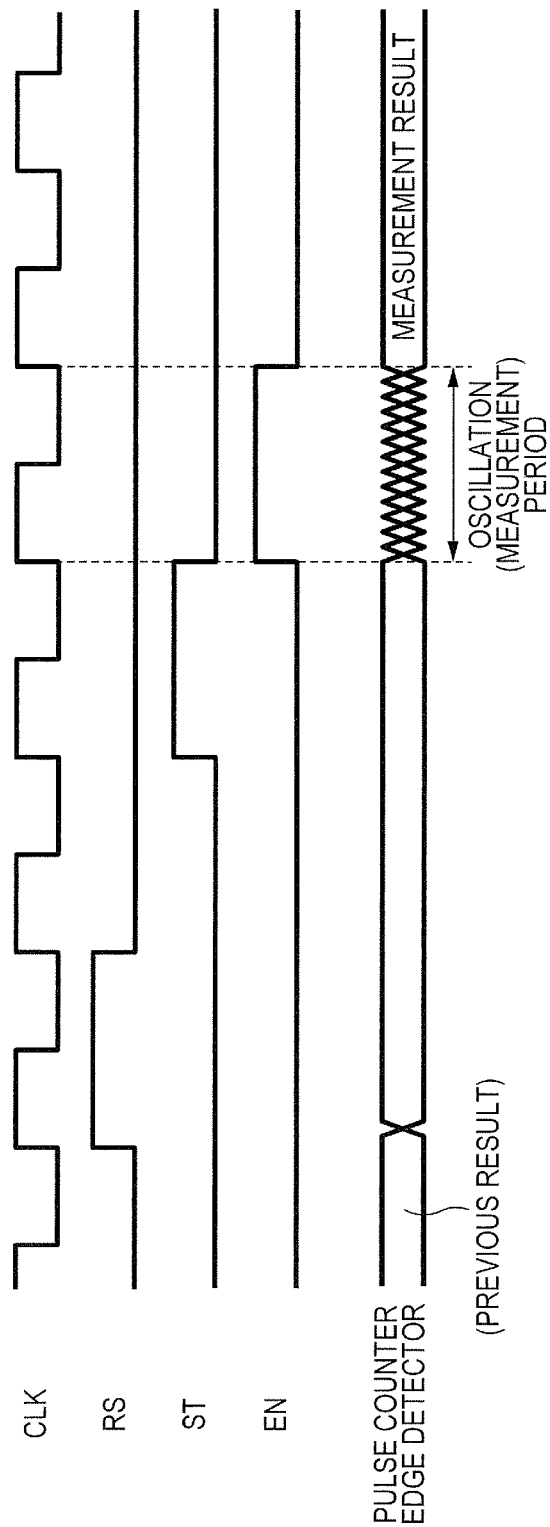
FIG. 4 is a timing chart of operation of the delay monitor #i of the first embodiment.

(Operation of calculating a delay value) Next, an operation of calculating Cd and Td by the CPU #8 after the startup of the delay monitor #i is described using FIG. 4.

First, when a "1" is written to the measurement start bit in the control register 22 under control of the CPU #8, the control register 22 outputs a reset signal RS to the pulse counter 24. When receiving the reset signal RS, the pulse counter 24 resets the detection result so far held in it.

Then, upon the elapse of one cycle of the reference clock CLK after outputting the reset signal RS, the control register 22 outputs a high-level measurement start signal ST to the flip-flop 25. The flip-flop 25 outputs a high-level oscillator enable signal EN to the first signal line of the ring oscillator 26 for a measurement period during one cycle of the reference clock CLK from timing when the measurement start signal ST falls.

During a period when the oscillator enable signal EN remains at high level (namely, measurement period), the pulse counter 24 counts the number of oscillations Cdc of the oscillation signal output by the ring oscillator 26. The edge detector 23 detects the number of gate stages Cdf across which the edges of the oscillator enable signal EN have propagated at timing when the oscillator enable signal EN changes to low level.

Based on the outputs Cdc and Cdf of the delay monitor #i, the CPU #8 calculates the number of stages across which the EN signal edges can propagate Cd and an average delay time per gate element stage Td in accordance with the equations (A1) and (A2) and uses Td as a delay value for determining if aged deterioration occurs.

Figure 5:
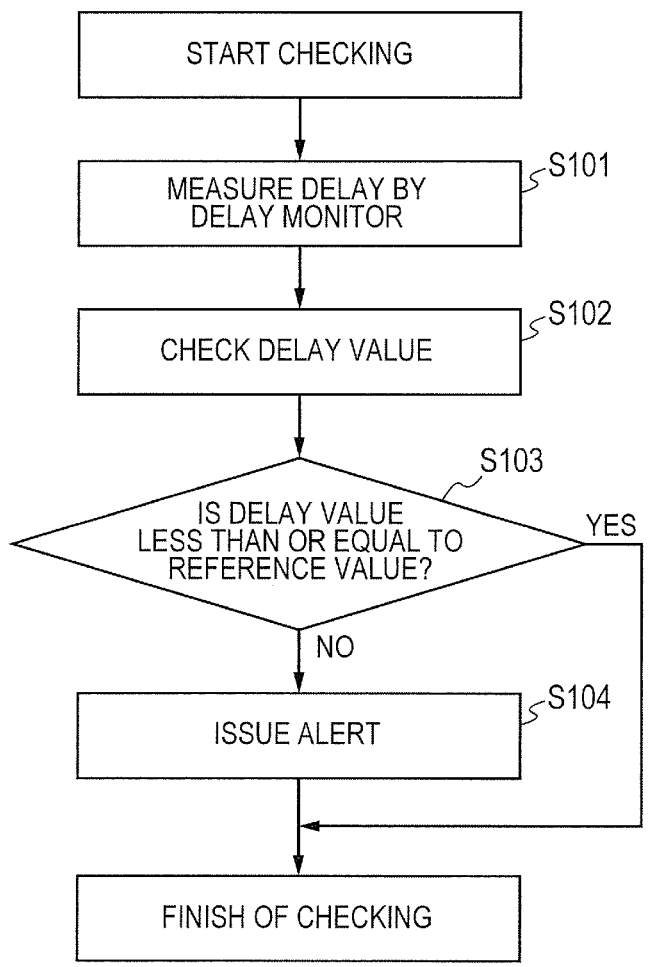
FIG. 5 is a flowchart illustrating a procedure for checking a delay value obtained by a delay monitor #i (i=any number from 00 to 16) in the first embodiment.

(Determining if aged deterioration occurs) FIG. 5 is a flowchart illustrating a procedure for checking a delay value obtained by a delay monitor #i (i=any number from 00 to 16) in the first embodiment.

As illustrated in FIG. 5, first, the CPU #8 sets "1" for the measurement start bit in the control register 22 and starts up the delay monitor #i. The ring oscillator 26 within the delay monitor #i performs an oscillation operation (step S101).

Then, the CPU #8 receives the outputs from the edge detector 23 and the pulse counter 24 of the delay monitor #i, calculates a delay value Td in accordance with the equations (A1) and (A2), and checks the delay value Td (step S102).

If the delay value Td is less than or equal to a reference value (YES, as decided at step S103), the CPU #8 finishes off the checking.

If the delay value Td has exceeded the reference value (NO, as decided at step S103), the CPU #8 determines that a module proximate to the delay monitor #i suffers from aged deterioration and issues an alert outside the LSI 1 (S104).

In the above-described operation, timing to start up the delay monitor #i and check the delay value should be a time when the system is booted or at regular intervals (periodical). Besides, starting up the delay monitor #i and checking the delay value may be performed in conjunction with other operations taking place in the system that employs this LSI 1 (if the LSI is incorporated in an automobile, for example, at a time when the automobile starts to move, at a time when it stops, when the engine speed has reached and exceeded a certain speed, etc.). Besides, starting up the delay monitor #i and checking the delay value may be performed by a maintenance instruction given by a computer system administrator.

The reference value can be set to a value that can secure a time before a tolerable upper limit value is reached. A time before a tolerable upper limit value is reached, that is, a time before a fault may occur varies depending on the system that employs the LSI. The reference value can be obtained beforehand by simulation or from the result of a test conducted in a development phase of the LSI or the system that employs the LSI. Besides, the reference value may not be an average delay time per gate element stage Td, but may be its function. For example, it may be Cdc and Cdf themselves which are the outputs of the delay monitor #i. In a case where accuracy requirement is not high, the reference value may be Cdc only. In a case where some degree of accuracy is required, the reference value may be concatenated data in which upper bits represent Cdc and lower bits represent Cdf. In a case where Cdc and Cdf are directly used, the calculation load of the CPU is reduced and control becomes simple.

(Effect) As described above, according to the present embodiment, if having detected aged deterioration in the LSI by observing the delay monitor, the CPU can issue an alert.

Second Embodiment

Figure 6:
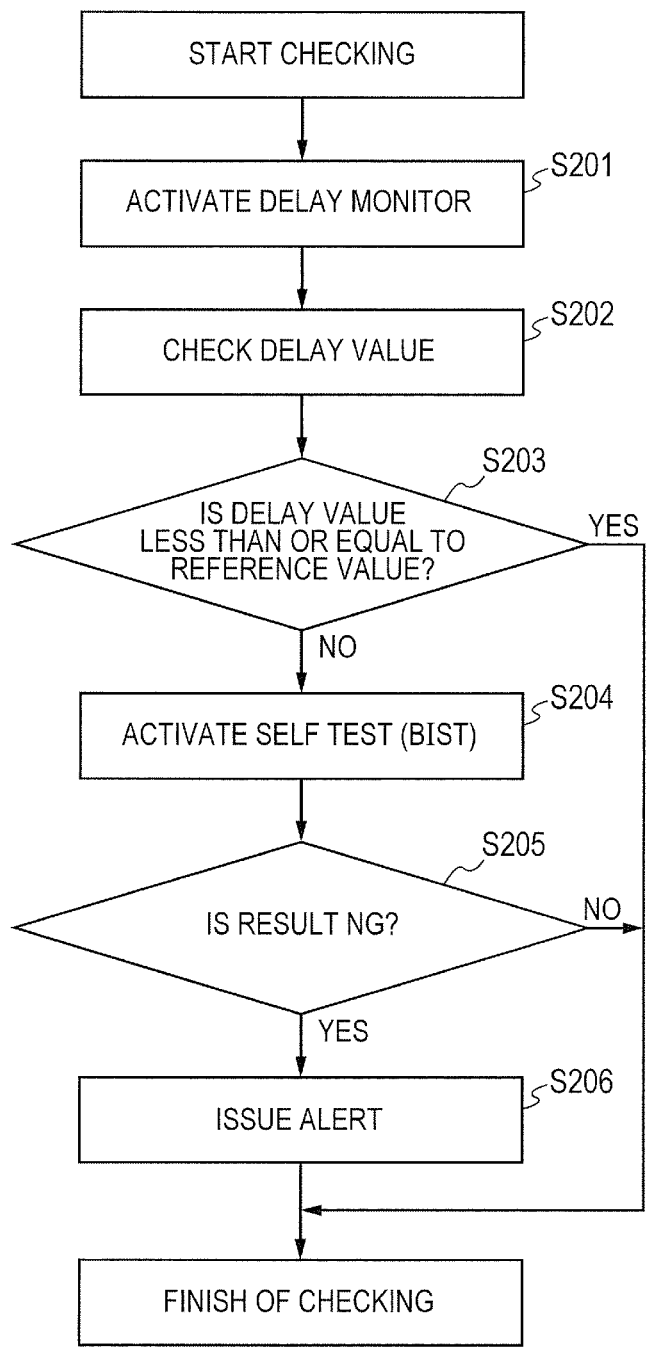
FIG. 6 is a flowchart illustrating a procedure for checking a delay value obtained by a delay monitor #i (i=any number from 00 to 16) in a second embodiment.

FIG. 6 is a flowchart illustrating a procedure for checking a delay value obtained by a delay monitor #i (i=any number from 00 to 16) in a second embodiment.

As illustrated in FIG. 6, first, the CPU #8 sets "1" for the measurement start bit in the control register 22 and starts up the delay monitor #i. The ring oscillator 26 within the delay monitor #i performs an oscillation operation (step S201).

Then, the CPU #8 receives the outputs from the edge detector 23 and the pulse counter 24 of the delay monitor #i, calculates a delay value Td in accordance with the equations (A1) and (A2), and checks the delay value Td (step S202).

If the delay value Td is less than or equal to a reference value (YES, as decided at step S203), the CPU #8 finishes off the checking.

If the delay value Td has exceeded the reference value (No, as decided at step S203), the CPU #8 gives the JTAG controller 11 an appropriate sequence signal by which a self test (BIST (Built-In Self Test)) is performed for the LSI 1 to check for a portion that malfunctions due to deterioration (step S204).

If no problem is found by the self test (NO, as decided at step S205), the CPU #8 finishes off the checking. If a problem is found by the self test (YES, as decided at step S205), the CPU #8 determines that the LSI 1 suffers from aged deterioration and issues an alert outside the LSI 1 (S206).

(Effect) As described above, according to the present embodiment, if having detected aged deterioration in the LSI by observing the delay monitor, the CPU can execute the BIST to check for a portion that malfunctions due to aged deterioration.

Third Embodiment

Figure 7:
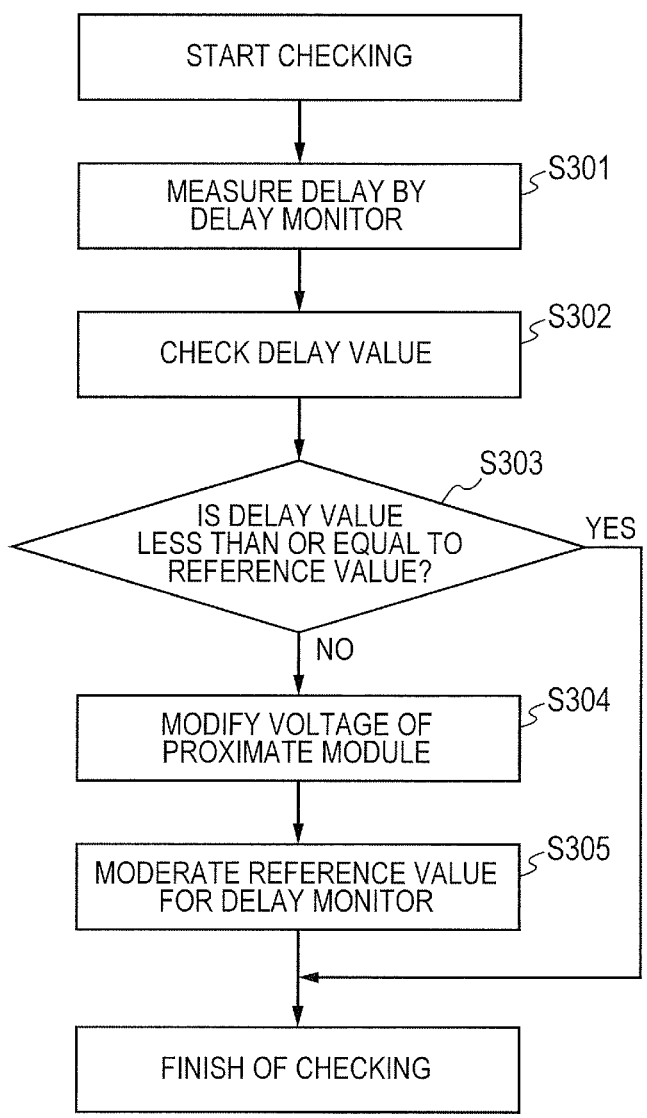
FIG. 7 is a flowchart illustrating a procedure for checking a delay value obtained by a delay monitor #i (i=any number from 00 to 16) in a third embodiment.

FIG. 7 is a flowchart illustrating a procedure for checking a delay value obtained by a delay monitor #i (i=any number from 00 to 16) in a third embodiment.

As illustrated in FIG. 7, first, the CPU #8 sets "1" for the measurement start bit in the control register 22 and starts up the delay monitor #i. The ring oscillator 26 within the delay monitor #i performs an oscillation operation (step S301).

Then, the CPU #8 receives the outputs from the edge detector 23 and the pulse counter 24 of the delay monitor #i, calculates a delay value Td in accordance with the equations (A1) and (A2), and checks the delay value Td (step S302).

If the delay value Td is less than or equal to a reference value (YES, as decided at step S303), the CPU #8 finishes off the checking.

If the delay value Td has exceeded the reference value (NO, as decided at step S303), the CPU #8 determines that a module proximate to the delay monitor #i suffers from aged deterioration and controls the power supply circuit 10 to decrease the power supply voltage to the module proximate to the delay monitor #i. In the case of the LSI having a built-in power regulator, control of the power supply voltage is implemented such that the CPU #8 outputs to the power regulator a signal that instructs the power regulator to decrease the power supply voltage. In the case of the LSI not having a power regulator, the CPU #8 issues a request to decrease the power supply voltage outside the LSI and a regulator external to the LSI performs control to decrease the power supply voltage. CPU #8 calculates a difference between the reference value and the delay value Td and, based on the difference, determines an amount of decrease in the power supply voltage. For example, the CPU #8 decreases the power supply voltage by 10 mV for every 1 ns calculated as the difference between the reference value and the delay value Td. Because aged deterioration is liable to progress when the voltage is higher, it is possible to slow down the progress of the deterioration by decreasing the power supply voltage (step S304).

Furthermore, the CPU #8 moderates (increases) the reference value. The reason why the reference value is moderated is because a gate delay in the delay monitor #i increases due to having decreased the power supply voltage to the module proximate to the delay monitor #i (step S305).

(Effect) As described above, according to the present embodiment, if having detected aged deterioration in the LSI by observing the delay monitor, the CPU decreases the power supply voltage to the module proximate to the delay monitor, so that the product life of the LSI can be extended.

As another method of controlling the power supply voltage, the magnitude of the power supply voltage may be modified depending on the count value Cdc output by the pulse counter according to a table exemplified in FIG. 8.

As for the amount of decrease in the power supply voltage and the voltages given in the table of FIG. 8 for the third embodiment, an appropriate value varies depending on a fabrication process, usage environment, etc. So, a value or a set of values suitable for each individual LSI or system may be used.

Fourth Embodiment

Figure 9:
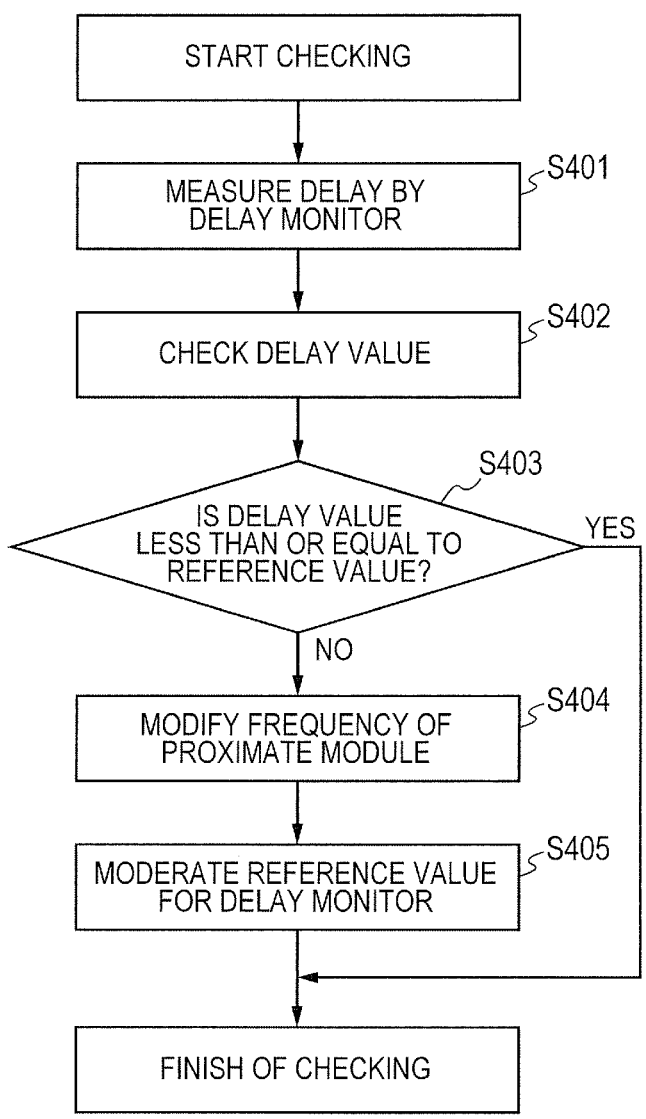
FIG. 9 is a flowchart illustrating a procedure for checking a delay value obtained by a delay monitor #i (i=any number from 00 to 16) in a fourth embodiment.

FIG. 9 is a flowchart illustrating a procedure for checking a delay value obtained by a delay monitor #i (i=any number from 00 to 16) in a fourth embodiment.

As illustrated in FIG. 9, first, the CPU #8 sets "1" for the measurement start bit in the control register 22 and starts up the delay monitor #i. The ring oscillator 26 within the delay monitor #i performs an oscillation operation (step S401).

Then, the CPU #8 receives the outputs from the edge detector 23 and the pulse counter 24 of the delay monitor #i, calculates a delay value Td in accordance with the equations (A1) and (A2), and checks the delay value Td (step S402).

If the delay value Td is less than or equal to a reference value (YES, as decided at step S403), the CPU #8 finishes off the checking.

If the delay value Td has exceeded the reference value (NO, as decided at step S403), the CPU #8 determines that a module proximate to the delay monitor #i suffers from aged deterioration and controls the clock supply circuit 33 to decrease the operating frequency of the module proximate to the delay monitor #i. The CPU #8 calculates a difference between the reference value and the delay value Td and, based on the difference, determines an amount of decrease in the operating frequency of the proximate module. For example, the frequency division ratio of the clock supplied to the module is increased for every 5 ns calculated as the difference between the reference value and the delay value Td. Frequency control may be provided to automatically decrease the frequency within the LSI. Alternatively, the clock frequency may be controlled from the CPU #8 under the control of OS or software. Because aged deterioration is liable to progress when the frequency (i.e., cycle time) is higher, it is possible to slow down the progress of the deterioration by decreasing the operating frequency (step S404).

Furthermore, the CPU #8 moderates (increases) the reference value. The reason why the reference value is moderated is because a deteriorated gate does not recover even if the operating frequency of the module proximate to the delay monitor # has been decreased and, consequently, if the same reference value is used, a delay value Td obtained in every subsequent check operation will exceed the reference value (step S405).

(Effect) As described above, according to the present embodiment, if having detected aged deterioration in the LSI by observing the delay monitor, the CPU decreases the operating frequency of the module proximate to the delay monitor, so that the product life of the LSI can be extended.

As another method of controlling the frequency, the magnitude of the frequency may be modified by changing the frequency division ratio depending on the count value Cdc output by the pulse counter according to a table exemplified in FIG. 10.

As for the amount of decrease in the frequency and the frequency division ratios given in the table of FIG. 10 for the fourth embodiment, an appropriate value varies depending on a fabrication process, usage environment, etc. So, a value or a set of values suitable for each individual LSI or system may be used.

Fifth Embodiment

Figure 11:
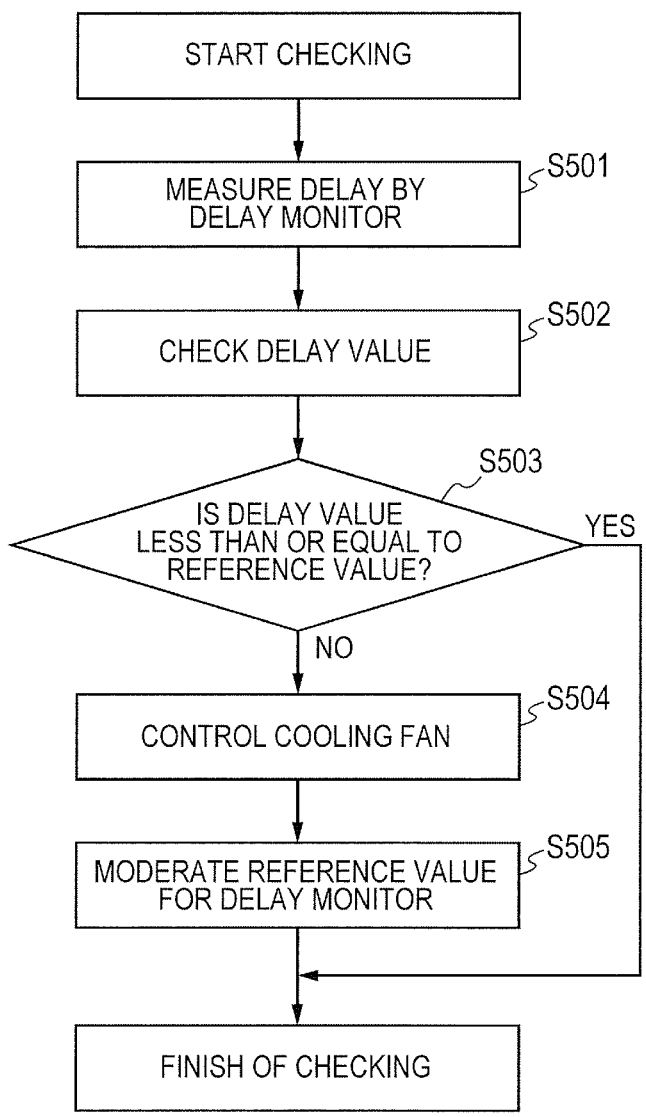
FIG. 11 is a flowchart illustrating a procedure for checking a delay value obtained by a delay monitor #i (i=any number from 00 to 16) in a fifth embodiment.

FIG. 11 is a flowchart illustrating a procedure for checking a delay value obtained by a delay monitor #i (i=any number from 00 to 16) in a fifth embodiment.

As illustrated in FIG. 11, first, the CPU #8 sets "1" for the measurement start bit in the control register 22 and starts up the delay monitor #i. The ring oscillator 26 within the delay monitor #i performs an oscillation operation (step S501).

Then, the CPU #8 receives the outputs from the edge detector 23 and the pulse counter 24 of the delay monitor #i, calculates a delay value Td in accordance with the equations (A1) and (A2), and checks the delay value Td (step S502).

If the delay value Td is less than or equal to a reference value (YES, as decided at step S503), the CPU #8 finishes off the checking.

If the delay value Td has exceeded the reference value (NO, as decided at step S503), the CPU #8 determines that a module proximate to the delay monitor #i suffers from aged deterioration and performs control to increase the spinning speed or frequency of a cooling fan that is externally attached to the LSI package in order to decrease the temperature.

The CPU #8 calculates a difference between the reference value and the delay value Td and, based on the difference, determines an amount of control of the cooling fan. For example, the spinning speed of the cooling fan is incremented by one step or the temperature setting of a sensor for turning on the cooling fan is incremented by one step for every 1 ns calculated as the difference between the reference value and the delay value Td. Because aged deterioration is liable to progress when the temperature is higher, it is possible to slow down the progress of the deterioration by decreasing the temperature (step S504).

Furthermore, the CPU #8 moderates (increases) the reference value. The reason why the reference value is moderated is because a deteriorated gate does not recover even if the cooling fan is controlled and, consequently, if the same reference value is used, a delay value obtained in every subsequent check operation will exceed the reference value (step S505).

(Effect) As described above, according to the present embodiment, if having detected aged deterioration in the LSI by observing the delay monitor, the CPU performs control to increase the spinning speed or frequency of the cooling fan that is externally attached to the LSI package, so that the product life of the LSI can be extended.

Sixth Embodiment

Tasks are assigned to the CPUs #0 to #8 respectively by OS. Each task produces a different load on CPU according to its nature. For example, a CPU that executes a complicated calculation task involves a large number of gates switching at a high frequency. A CPU that executes a simple calculation task involves a small number of gates switching at a relatively low frequency. A CPU that executes a control task such as monitoring for an input from outside involves most of gates not switching and a part of gates only operating at a very low frequency.

The present embodiment interchanges tasks assigned to a plurality of CPUs, if aged deterioration has been determined.

Figure 12:
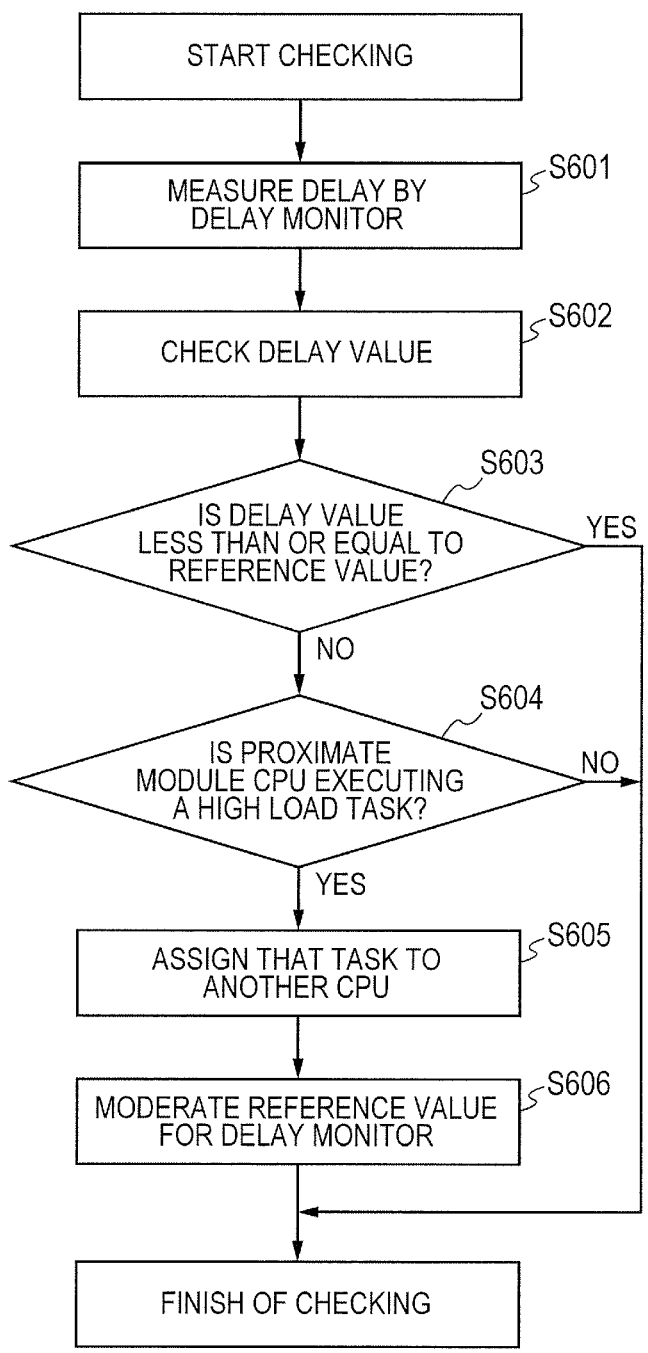
FIG. 12 is a flowchart illustrating a procedure for checking a delay value obtained by a delay monitor #i (i=any number from 00 to 16) in a sixth embodiment.

FIG. 12 is a flowchart illustrating a procedure for checking a delay value obtained by a delay monitor #i (i=any number from 00 to 16) in the sixth embodiment.

As illustrated in FIG. 12, first, the CPU #8 sets "1" for the measurement start bit in the control register 22 and starts up the delay monitor #i. The ring oscillator 26 within the delay monitor #i performs an oscillation operation (step S601).

Then, the CPU #8 receives the outputs from the edge detector 23 and the pulse counter 24 of the delay monitor #i, calculates a delay value Td in accordance with the equations (A1) and (A2), and checks the delay value Td (step S602).

If the delay value Td is less than or equal to a reference value (YES, as decided at step S603), the CPU #8 finishes off the checking.

If the delay value Td has exceeded the reference value (NO, as decided at step S603), the CPU #8 determines that a module proximate to the delay monitor #i suffers from aged deterioration. When the module proximate to the delay monitor #i is a CPU that executes a high load task (YES, as decided at step S604), the CPU #8 picks out another CPU for which a delay value Td obtained by its proximate delay monitor is less than or equal to the reference value and that executes a low load task or does not execute any task. The CPU #8 assigns the high load task so far executed by the CPU as the proximate module to another CPU thus picked out. If another CPU was executing a low load task until then, the CPU #8 also assigns the low load task to the CPU as the proximate module. When a CPU is under a high load, its gates will switch more frequently and its operating frequency and temperature rise. Consequently, aged deterioration progresses faster. Therefore, it is possible to slow down the progress of the deterioration by reducing the CPU load (step S605).

Furthermore, the CPU #8 moderates (increases) the reference value. The reason why the reference value is moderated is because a deteriorated gate does not recover even if the task executed by the CPU as the module proximate to the delay monitor # has been changed to a low load task and, consequently, if the same reference value is used, a delay value obtained in every subsequent check operation will exceed the reference value (step S606).

(Effect) As described above, according to the present embodiment, if having detected aged deterioration in the LSI by observing the delay monitor, the CPU interchanges tasks assigned to a plurality of CPUs, so that the product life of the LSI can be extended.

As for the CPU proximate to the delay monitor, determined as the one suffering from aged deterioration, software such as OS may store its delay value and a task whose load is suitable for the CPU may be assigned to the CPU subsequently, based on the delay value.

Seventh Embodiment

In this embodiment, it is assumed that one of DSP #0 and DSP #1 serves as a main operator and the other serves as a sub-operator. It is assumed that, in an initial state, DSP #0 serves as a main operator and DSP #1 serves as a sub-operator.

Almost all computations are executed by the main operator. However, when executing computations for which the processing speed of only the main operator is not enough, the sub-operator is used to aid the main operator.

The present embodiment interchanges the roles of DSP #0 and DSP #1, if aged deterioration has been determined.

Figure 13:
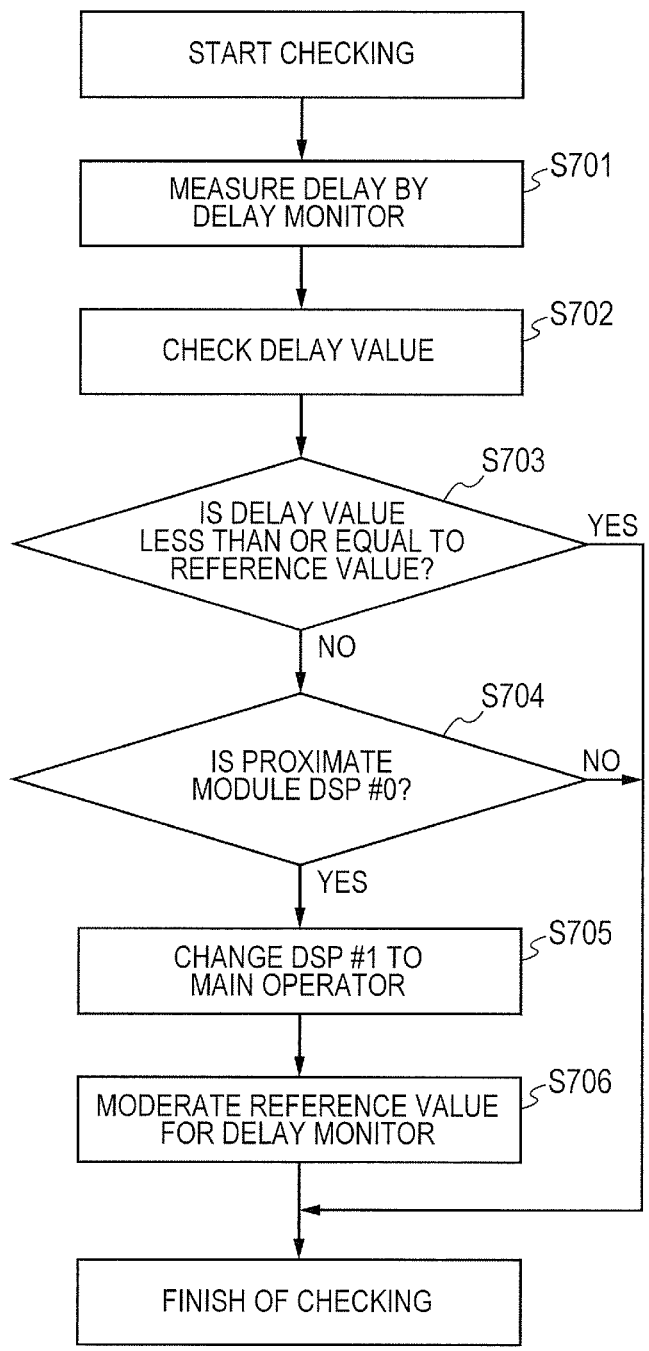
FIG. 13 is a flowchart illustrating a procedure for checking a delay value obtained by a delay monitor #i (i=any number from 00 to 16) in a seventh embodiment.

FIG. 13 is a flowchart illustrating a procedure for checking a delay value obtained by a delay monitor #i (i=any number from 00 to 16) in the seventh embodiment.

As illustrated in FIG. 13, first, the CPU #8 sets "1" for the measurement start bit in the control register 22 and starts up the delay monitor #i. The ring oscillator 26 within the delay monitor #i performs an oscillation operation (step S701).

Then, the CPU #8 receives the outputs from the edge detector 23 and the pulse counter 24 of the delay monitor #i, calculates a delay value Td in accordance with the equations (A1) and (A2), and checks the delay value Td (step S702).

If the delay value Td is less than or equal to a reference value (YES, as decided at step S703), the CPU #8 finishes off the checking.

If the delay value Td has exceeded the reference value (NO, as decided at step S703), the CPU #8 determines that a module proximate to the delay monitor #i suffers from aged deterioration. When the module proximate to the delay monitor #i is DSP #0 that serves as the main operator (YES, as decided at step S704), and if a delay value Td obtained by a delay monitor proximate to DSP #1 that serves as a sub-operator is less than or equal to the reference value, the CPU #8 changes DSP #1 to the main operator and DSP #0 to the sub-operator. Interchanging between the main operator and the sub-operator can be processed within OS, if OS determines their assignments. Alternative methods of interchanging may be interchanging them by application software, interchanging the I/O interfaces of DSP0 and DSP1 by hardware, and interchanging the identifiers IDs of DSP #0 and DSP #1, among others. When a DSP is under a high load, its gates will switch more frequently and its operating frequency and temperature rise. Consequently, aged deterioration progresses faster. Therefore, it is possible to slow down the progress of the deterioration by reducing the DSP load (step S705).

Furthermore, the CPU #8 moderates (increases) the reference value. The reason why the reference value is moderated is because a deteriorated gate does not recover even if DSP #0, the module proximate to the delay monitor #, has been changed to the sub-operator and, consequently, if the same reference value is used, a delay value obtained in every subsequent check operation will exceed the reference value (step S706).

(Effect) As described above, according to the present embodiment, if having detected aged deterioration in the LSI by observing the delay monitor, the CPU interchanges the roles of the main operator and the sub-operator, so that the product life of the LSI can be extended.

Eighth Embodiment

In this embodiment, it is assumed that one of CPUs #0 to #8 serves as a main CPU and seven CPUs #1 to #7 serve as sub-CPUs and CPU #8 executes a program that determines if aged deterioration occurs and implements control, based on a result of the determination. It is assumed that, in an initial state, CPU #0 serves as a main CPU and CPUs #1 to #7 serve as sub-CPUs.

Almost all instructions are executed by the main CPU. However, when executing instructions for which the processing speed of only the main CPU is not enough, the sub-CPUs are used to aid the main CPU.

The present embodiment switches the main CPU from CPU #0 to another CPU, if aged deterioration has been determined.

Figure 14:
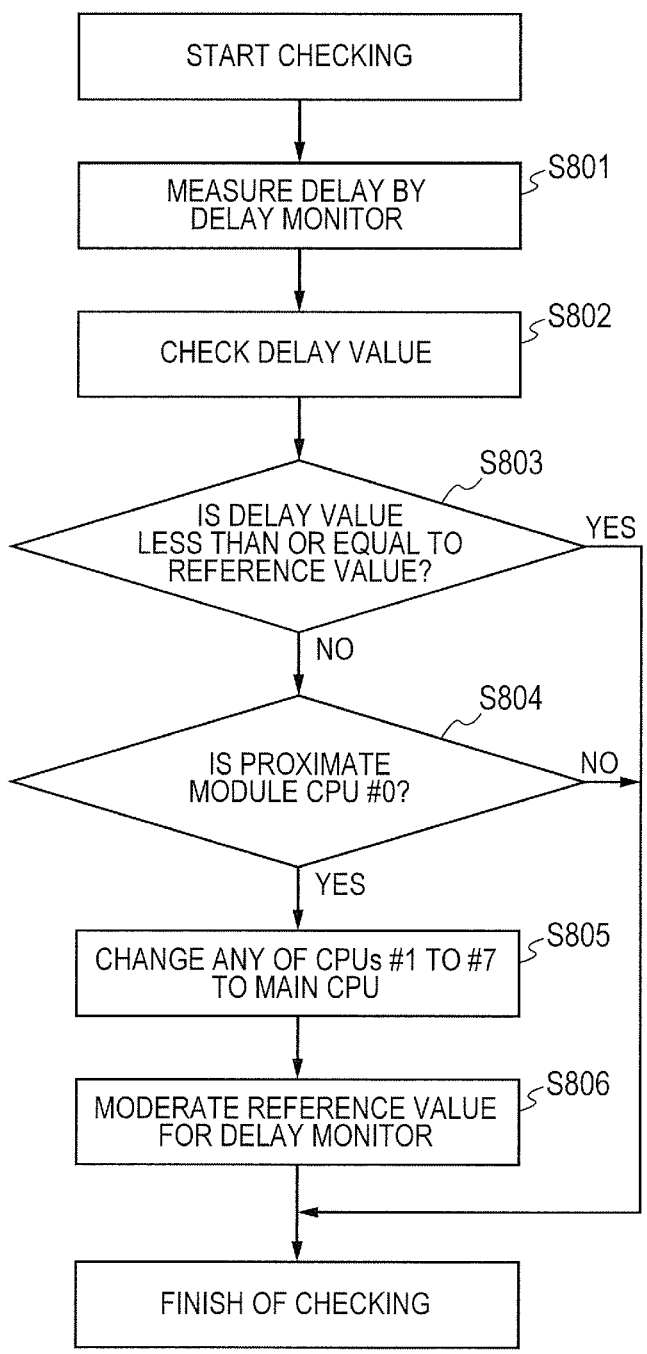
FIG. 14 is a flowchart illustrating a procedure for checking a delay value obtained by a delay monitor #i (i=any number from 00 to 16) in an eighth embodiment.

FIG. 14 is a flowchart illustrating a procedure for checking a delay value obtained by a delay monitor #i (i=any number from 00 to 16) in the eighth embodiment.

As illustrated in FIG. 14, first, the CPU #8 sets "1" for the measurement start bit in the control register 22 and starts up the delay monitor #i. The ring oscillator 26 within the delay monitor #i performs an oscillation operation (step S801).

Then, the CPU #8 receives the outputs from the edge detector 23 and the pulse counter 24 of the delay monitor #i, calculates a delay value Td in accordance with the equations (A1) and (A2), and checks the delay value Td (step S802).

If the delay value Td is less than or equal to a reference value (YES, as decided at step S803), the CPU #8 finishes off the checking.

If the delay value Td has exceeded the reference value (NO, as decided at step S803), the CPU #8 determines that a module proximate to the delay monitor #i suffers from aged deterioration. If the module proximate to the delay monitor #i is CPU #0 that serves as the main CPU (YES, as decided at step S804), the CPU #8 picks out a CPU (as CPU #A) for which a delay value obtained by its proximate delay monitor is less than or equal to the reference value among the CPUs #1 to #7. The CPU #8 changes CPU #0 to a sub-CPU and CPU #A to the main CPU. Interchanging between the main CPU and a sub-CPU may be processed within OS, if OS determines their assignments. Alternative methods of interchanging may be interchanging them by application software, interchanging the I/O interfaces of CPU #0 and CPU #A by hardware, and interchanging the identifiers IDs of CPU #0 and CPU #A, among others. When a CPU is under a high load, its gates will switch more frequently and its operating frequency and temperature rise. Consequently, aged deterioration progresses faster. Therefore, it is possible to slow down the progress of the deterioration by reducing the CPU load (step S805).

Furthermore, the CPU #8 moderates (increases) the reference value. The reason why the reference value is moderated is because a deteriorated gate does not recover even if CPU #0, the module proximate to the delay monitor #i, has been changed to a sub-CPU and, consequently, if the same reference value is used, a delay value obtained in every subsequent check operation will exceed the reference value (step S806).

(Effect) As described above, according to the present embodiment, if having detected aged deterioration in the LSI by observing the delay monitor, the CPU interchanges the roles of the main CPU and a sub-CPU, so that the product life of the LSI can be extended.

Ninth Embodiment

In this embodiment, it is assumed that seven CPUs #0 to #6 among the CPUs #0 to #8 are used as SMP (Symmetrical Multiple Processor) processors and CPU #7 serves as a standby CPU. Programs are processed in parallel by the SMP processors. Neither a clock nor a power supply voltage is supplied to the standby CPU.

In the present embodiment, if aged deterioration has been observed in one of the CPUs #0 to #6 operating as the SMP processors, a CPU suffered from aged deterioration is deactivated and, if a standby CPU is available, the standby CPU is put into operation as a SMP processor.

Figure 15:
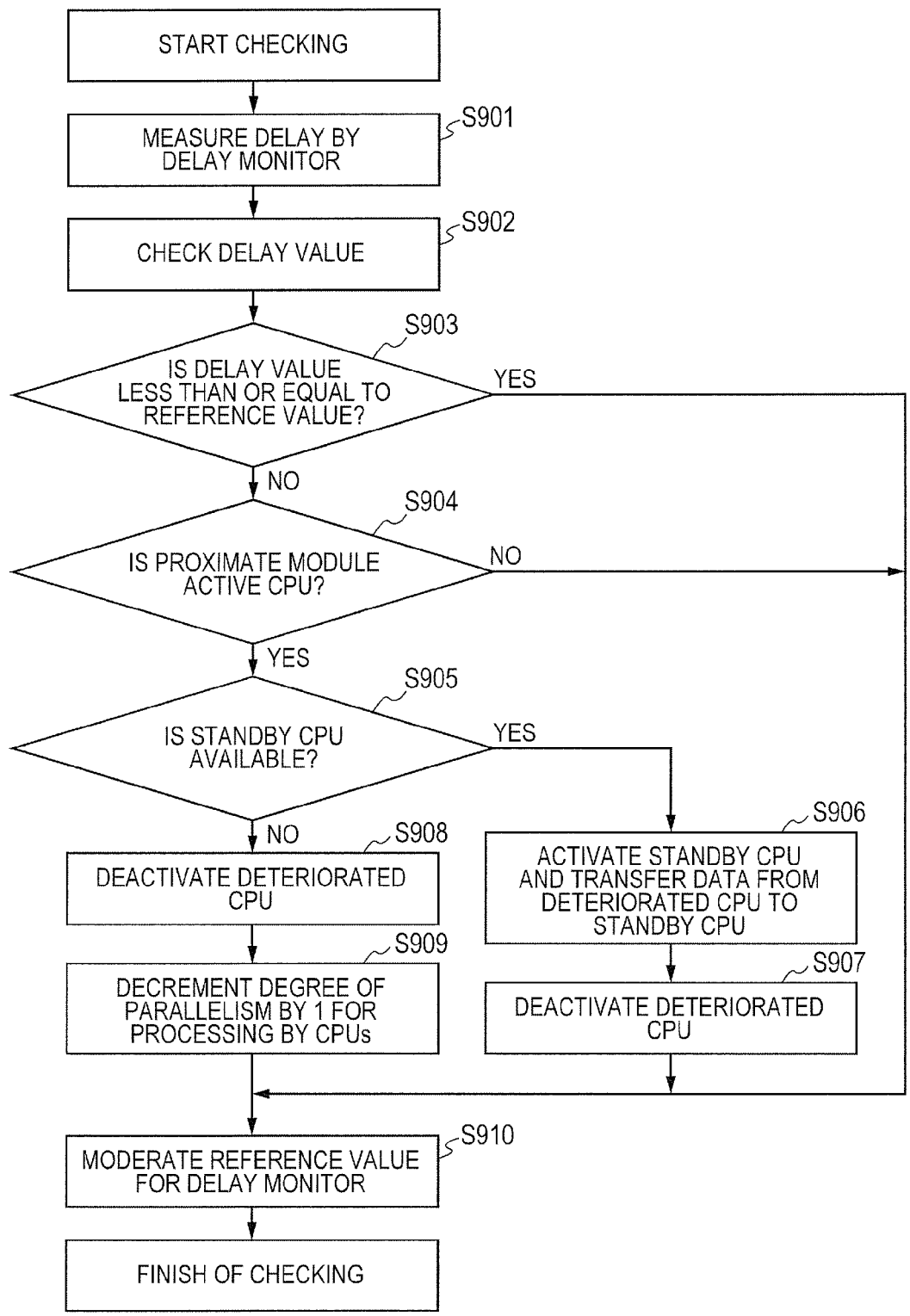
FIG. 15 is a flowchart illustrating a procedure for checking a delay value obtained by a delay monitor #i (i=any number from 00 to 16) in a ninth embodiment.

FIG. 15 is a flowchart illustrating a procedure for checking a delay value obtained by a delay monitor #i (i=any number from 00 to 16) in the ninth embodiment.

As illustrated in FIG. 15, first, the CPU #8 sets "1" for the measurement start bit in the control register 22 and starts up the delay monitor #i. The ring oscillator 26 within the delay monitor #i performs an oscillation operation (step S901).

Then, the CPU #8 receives the outputs from the edge detector 23 and the pulse counter 24 of the delay monitor #i, calculates a delay value Td in accordance with the equations (A1) and (A2), and checks the delay value Td (step S902).

If the delay value Td is less than or equal to a reference value (YES, as decided at step S903), CPU #8 finishes off the checking.

If the delay value Td has exceeded the reference value (NO, as decided at step S903), the CPU #8 determines that a module proximate to the delay monitor #i suffers from aged deterioration. If the module proximate to the delay monitor #i is an active CPU (hereinafter referred to as a deteriorated CPU) (YES, as decided at step S904), the CPU #8 checks whether a standby CPU is available.

If a standby CPU is available (CPU #7 remains as a standby) (YES, as decided at step S905), the CPU #8 activates the standby CPU (CPU #7) and transfers data from the deteriorated CPU to the standby CPU (step S906), and deactivates the deteriorated CPU (step S907).

If no standby CPU is available (CPU #7 is no longer a standby) (NO, as decided at step S905), the CPU #8 transfers data from the deteriorated CPU to another active CPU, deactivates the deteriorated CPU, decrements the degree of parallelism by one for processing by active CPUs, and lets them to execute programs (step S906).

Furthermore, the CPU #8 moderates (increases) the reference value. The reason why the reference value is moderated is because a deteriorated gate does not recover even if the deteriorated CPU, the module proximate to the delay monitor #i, has been deactivated and, consequently, if the same reference value is used, a delay value obtained in every subsequent check operation will exceed the reference value (step S910).

(Effect) As described above, according to the present embodiment, if having detected aged deterioration of a CPU by observing the delay monitor, the CPU uses a standby CPU instead of the deteriorated CPU, so that the product life of the LSI can be extended.

The description of the present embodiment concerns a case where the LSI has a standby CPU and, if a CPU has been deteriorated, the standby CPU is used instead of the deteriorated CPU. However, the present embodiment can be carried out similarly for DSPs, other functional IPs, or analog modules.

Tenth Embodiment

Figure 16:
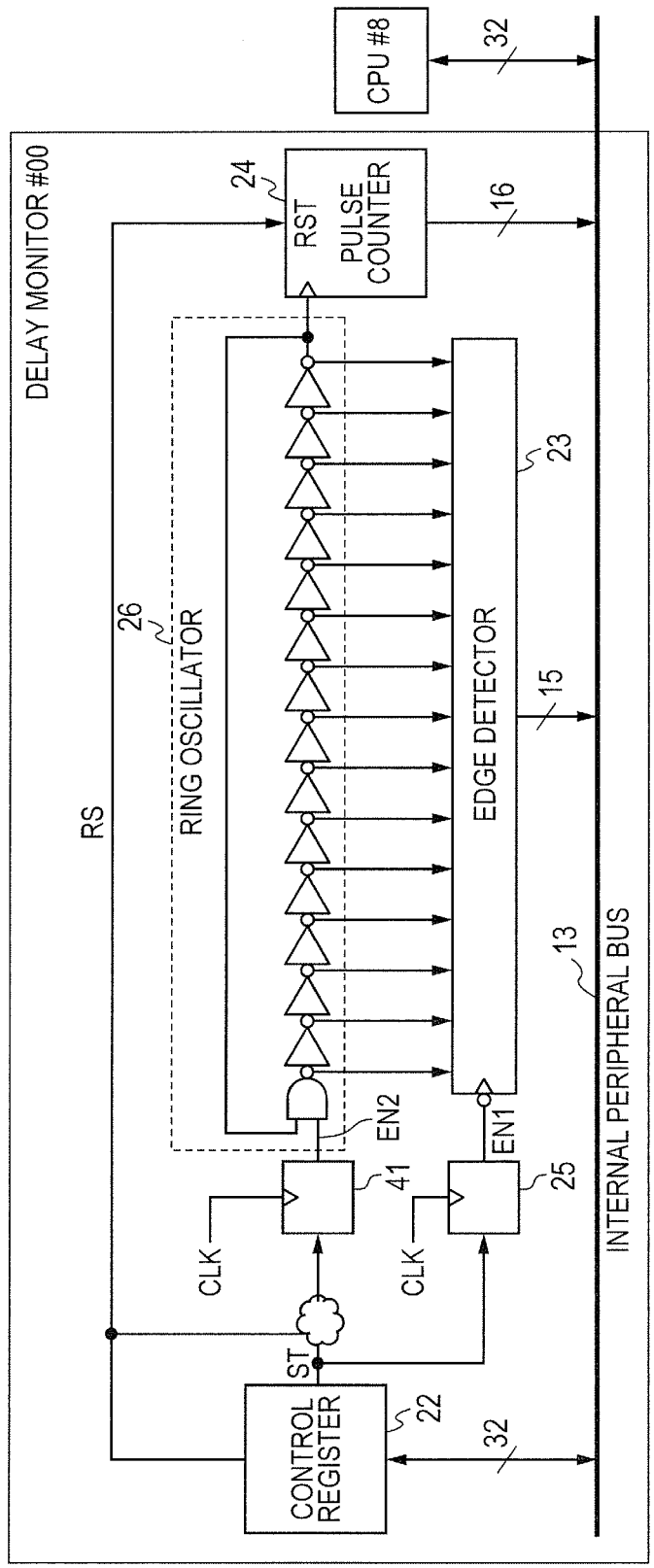
FIG. 16 is a diagram depicting a configuration of a delay monitor #i (i=any number from 00 to 16) of a tenth embodiment.

FIG. 16 is a diagram depicting a configuration of a delay monitor #i (i=any number from 00 to 16) of a tenth embodiment.

The delay monitor #i of the tenth embodiment differs from the delay monitor #i of the first embodiment shown in FIG. 3 in the following respect: the ring oscillator 26 in the delay monitor #i of the tenth embodiment continues to oscillate except for a predetermined number of clock cycles before and after a delay value measurement period, whereas the ring oscillator 26 in the delay monitor #i of the first embodiment oscillates only during a delay value measurement period.

In particular, the delay monitor #i of the tenth embodiment includes a logic circuit 42 and a flip-flop 41 in addition to the configuration shown in FIG. 3.

An oscillator enable signal EN1 output by a flip-flop 25 which is the same as for the first embodiment is supplied to the edge detector 23 and the pulse counter 24.

The logic circuit 42 receives a measurement start signal ST, a reset signal RS, and a reference clock CLK and outputs a result of a logical operation to the flip-flop 41. An oscillator enable signal EN2 output by the flip-flop 41 is supplied to the ring oscillator 26.

Figure 17:
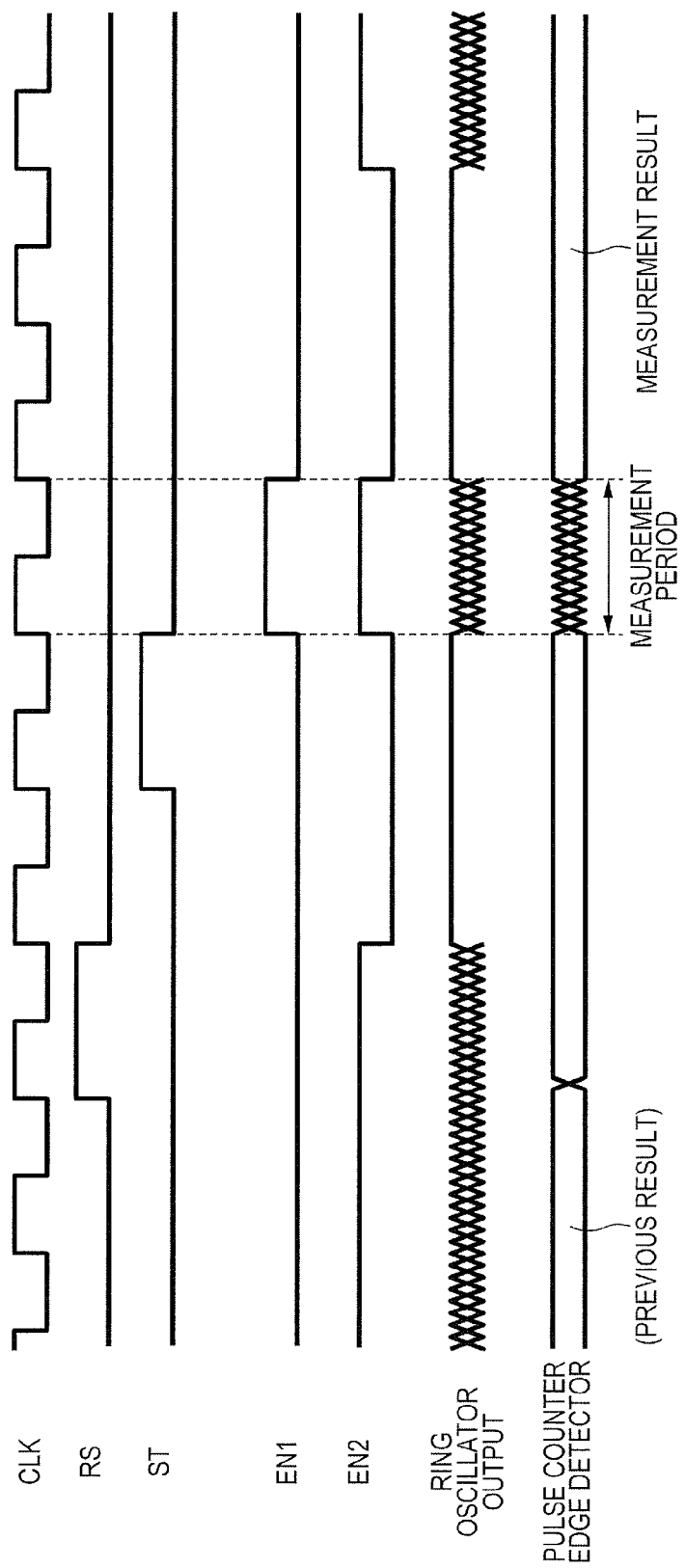
FIG. 17 is a timing chart of operation of the delay monitor #i of the tenth embodiment.

(Operation of calculating a delay value) Next, an operation of calculating Cd and Td by the CPU #8 after the startup of the delay monitor #i is described using FIG. 17.

First, the oscillator enable signal EN2 which is input to the first signal line of the ring oscillator 26 is set to high level by the logic circuit 42 and the flip-flop 41. The oscillator enable signal EN2 changing to high level causes the ring oscillator 26 to oscillate.

When a "1" is written to the measurement start bit in the control register 22 under control of the CPU #8, the control register 22 outputs a reset signal RS to the pulse counter 24. When receiving the reset signal RS, the pulse counter 24 resets the detection result so far held in it.

The logic circuit 42 and the flip-flop 41 change the oscillator enable signal EN2 which is input to the first signal line of the ring oscillator 26 from high level to low level at timing when the reset signal RS falls. The oscillator enable signal EN2 changing to low level causes the ring oscillator 26 to stop oscillation.

Then, upon the elapse of one cycle of the reference clock CLK after outputting the reset signal RS, the control register 22 outputs a high-level measurement start signal ST to the flip-flop 25. The flip-flop 25 outputs a high-level oscillator enable signal EN1 to the edge detector 23 for a measurement period during one cycle of the reference clock CLK from timing when the measurement start signal ST falls.

Besides, the logic circuit 42 and the flip-flop 41 output a high-level oscillator enable signal EN2 to the first signal line of the ring oscillator 26 for a measurement period during one cycle of the reference clock CLK from timing when the measurement start signal ST falls. The oscillator enable signal EN2 changing to high level causes the ring oscillator 26 to oscillate.

During a period when the oscillator enable signal EN1 remains at high level (namely, measurement period), the pulse counter 24 counts the number of oscillations Cdc of the oscillation signal output by the ring oscillator 26. The edge detector 23 detects the number of gate stages Cdf across which the edges of the oscillator enable signal EN2 have propagated at timing when the oscillator enable signal EN1 changes to low level.

Based on the outputs Cdc and Cdf of the delay monitor #i, the CPU #8 calculates the number of stages across which the EN signal edges can propagate Cd and an average delay time per gate element stage Td in accordance with the equations (A1) and (A2) and uses Td as a delay value for determining if aged deterioration occurs.

Besides, by the logic circuit 42 and the flip-flop 41, the oscillator enable signal EN2 which is input to the first signal line of the ring oscillator 26 is set to low level during two cycles of the reference clock CLK after the termination of the measurement period. The oscillator enable signal EN2 changing to low level causes the ring oscillator 26 to stop oscillation.

By the logic circuit 42 and the flip-flop 41, the oscillator enable signal EN2 which is input to the first signal line of the ring oscillator 26 is set to high level upon the elapse of two cycles of the reference clock CLK. The oscillator enable signal EN2 changing to high level causes the ring oscillator 26 to resume oscillation.

(Effect) As described above, the ring oscillator in the delay monitor of the present embodiment oscillates for a long time and its deterioration progresses faster. Thus, deterioration progress can be detected earlier.

Eleventh Embodiment

Figure 18:
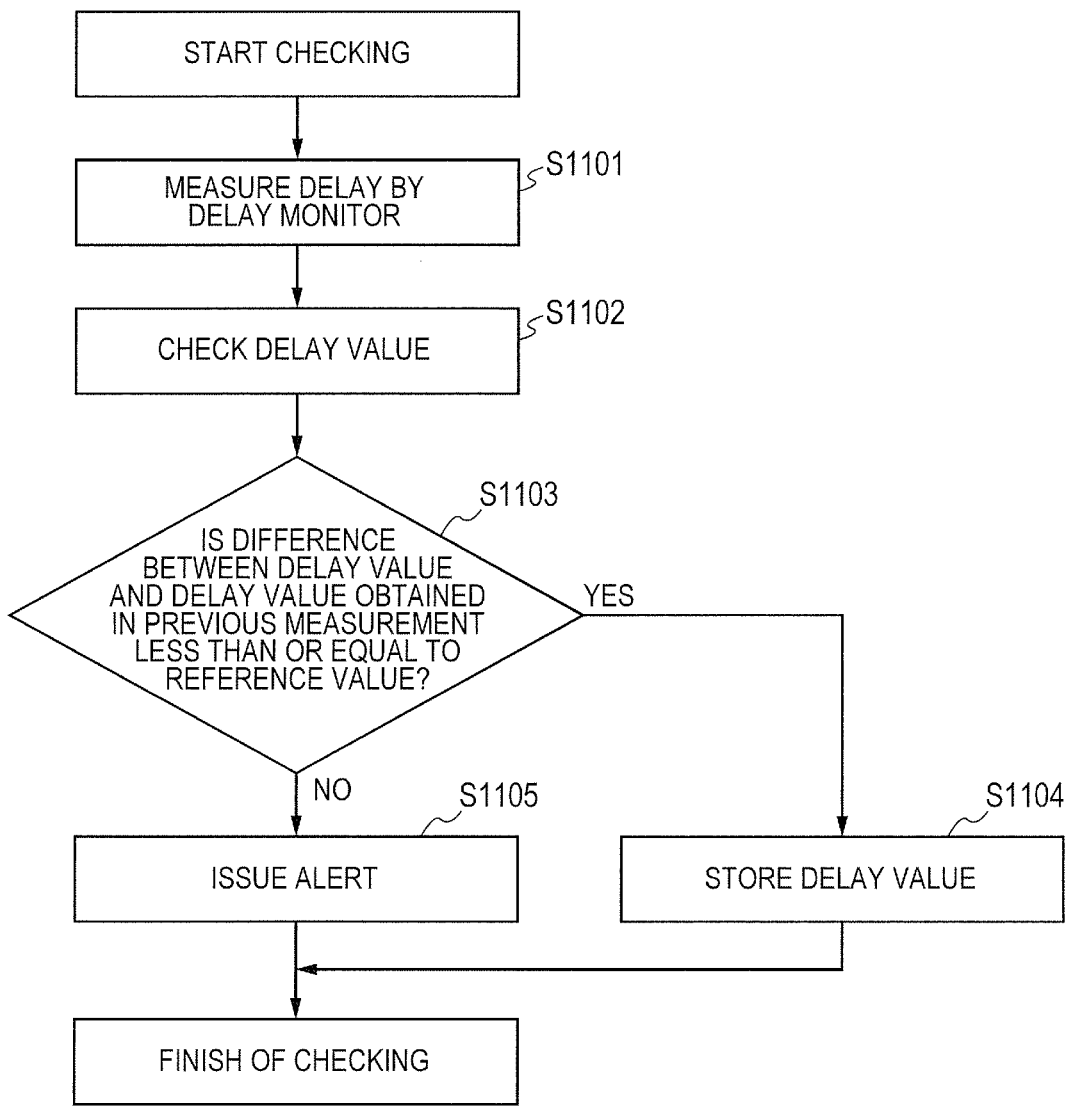
FIG. 18 is a flowchart illustrating a procedure for checking a delay value obtained by a delay monitor #i (i=any number from 00 to 16) in an eleventh embodiment.

FIG. 18 is a flowchart illustrating a procedure for checking a delay value obtained by a delay monitor #i (i=any number from 00 to 16) in an eleventh embodiment.

As illustrated in FIG. 18, first, the CPU #8 sets "1" for the measurement start bit in the control register 22 and starts up the delay monitor #i. The ring oscillator 26 within the delay monitor #i performs an oscillation operation (step S1101).

Then, the CPU #8 receives the outputs from the edge detector 23 and the pulse counter 24 of the delay monitor #i, calculates a delay value Td in accordance with the equations (A1) and (A2), and checks the delay value Td (step S1102).

If a difference between the delay value Td obtained in the current measurement and a delay value Td obtained in the previous measurement is less than or equal to a reference value (YES, as decided at step S1103), the CPU #8 stores the delay value Td into the built-in SRAM 6 (step S1104) and finishes off the checking.

If the above difference has exceeded the reference value (NO, as decided at step S1103), the CPU determines that a module proximate to the delay monitor #i suffers from aged deterioration and issues an alert outside the LSI 1 (S1105).

(Effect) As described above, according to the present embodiment, determining if aged deterioration occurs is based on a difference between a delay value obtained in the current measurement and a delay value obtained in the previous measurement. Thus, determining if aged deterioration occurs can be performed accurately in even an LSI in which modules vary greatly in performance.

In order to more accurately determine if aged deterioration occurs, not only a delay value obtained in the previous measurement, but also a history of older delay values obtained in the past may be retained. Determining if aged deterioration occurs may be done based on a statistical measure (such as a moving average) of these delay values.

Twelfth Embodiment

Figure 19:
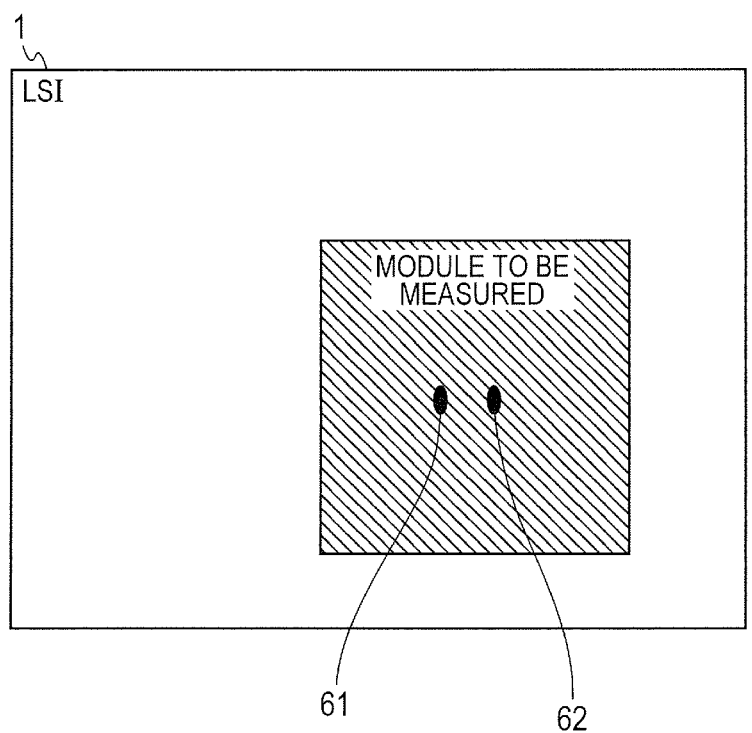
FIG. 19 is a diagram for explaining delay monitors of a twelfth embodiment.

In a twelfth embodiment, two delay monitors form one pair, as shown in FIG. 19. The two delay monitors are disposed near to each other.

A first delay monitor 61, which is one of the pair, is the delay monitor described in the tenth embodiment and shown in FIG. 16. The ring oscillator 26 in the first delay monitor 61 continues to oscillate except for a predetermined number of cycles before and after a delay value measurement period.

A second delay monitor 62, which is the other one of the pair, is the delay monitor described in the first embodiment and shown in FIG. 3. The second delay monitor 62 oscillates only during a delay value measurement period.

Because the first delay monitor 61 oscillates for a long time, it deteriorates faster than the second delay monitor 62. Since the first delay monitor 61 and the second delay monitor 62 are placed in very similar ambient environmental conditions such as a process variation, voltage, and temperature, by checking a difference between delay values respectively obtained by the first delay monitor 61 and the second delay monitor 62, it can be determined whether an proximate module has entered a period in which deterioration progress becomes significant (that is, the amount of change over time in the delay value is large).

If a difference between a delay value Td measured by the first delay monitor 61 and a delay value Td measured by the second delay monitor 62 has exceeded a reference value, the CPU #8 determines that a module proximate to the first delay monitor 61 and the second delay monitor 62 suffers from aged deterioration.

(Effect) As described above, according to the present embodiment, determining if aged deterioration occurs is based on a difference between a delay value obtained by the first delay monitor in which the ring oscillator oscillates for a long time and a delay value obtained by the second delay monitor in which the ring oscillator oscillates for a short time. Thus, determining if aged deterioration occurs can be performed accurately in even an LSI in which modules vary greatly in performance.

The embodiments disclosed herein are to be considered in all respects as illustrative and not restrictive. The scope of the present invention is indicated by the appended claims, rather than by the foregoing description, and all changes which come within the meaning and range of equivalency of the claims are therefore intended to be embraced therein.

What is claimed is:

1. A semiconductor device comprising:
   a plurality of modules;
   a plurality of delay monitors, wherein each delay monitor includes a ring oscillator having a plurality of gate elements and measures a delay time of said gate elements, and
   a control unit that determines if a module of the plurality of modules, which is proximate to said delay monitor suffers from aged deterioration, based on the delay time measured by said delay monitor,
   wherein, of said delay monitors, every two delay monitors disposed near to each other form one pair, wherein a ring oscillator in one delay monitor of said pair continues to oscillate except for a predetermined number of cycles before and after a delay time measurement period and a ring oscillator in the other delay monitor of said pair oscillates only during a delay time measurement period, and said control unit determines if the module suffers from aged deterioration, according to a difference between a delay time measured by said one delay monitor and a delay time measured by said other delay monitor.

2. The semiconductor device according to claim 1, wherein said control unit issues an alert, if having determined that said module suffers from aged deterioration.

3. The semiconductor device according to claim 1, wherein said control unit performs a built-in self test of said semiconductor device, if having determined that said module suffers from aged deterioration.

4. The semiconductor device according to claim 1, wherein said control unit decreases the power supply voltage to the module proximate to said delay monitor, if having determined that said module suffers from aged deterioration.

5. The semiconductor device according to claim 1, wherein said control unit decreases the operating frequency of the module proximate to said delay monitor, if having determined that said module suffers from aged deterioration.

6. The semiconductor device according to claim 1, wherein said control unit increases the spinning speed or frequency of a fan disposed near to said delay monitor, if having determined that the module suffers from aged deterioration.

7. The semiconductor device according to claim 1, wherein said semiconductor device includes processors and said control unit, if having determined that said module suffers from aged deterioration, and when the module proximate to said delay monitor is a processor that executes a high load task, assigns said task to another processor.

8. The semiconductor device according to claim 1, wherein said control unit determines if the module suffers from aged deterioration, depending on whether or not the delay time measured by said delay monitor exceeds a predetermined reference value.

9. The semiconductor device according to claim 1, wherein said semiconductor device includes processors, one of the processors serving as a main processor and the remaining processors serving as sub-processors, and said control unit, if having determined that said module suffers from aged deterioration, and when the module proximate to said delay monitor is a processor that serves as the main processor, changes the processor as said proximate module to serve as a sub-processor and changes a processor serving as a sub-processor to serve as the main processor.

10. The semiconductor device according to claim 9, wherein said processors have their respective identifiers IDs and changing a processor serving as a sub-processor to serve as the main processor is done by interchanging the identifiers IDs of the sub-processor and the processor serving as the main processor at that time.

11. The semiconductor device according to claim 1, wherein said semiconductor device includes processors, wherein a part of said processors can serve as a stand-by processor, and said control unit, if having determined that said module suffers from aged deterioration, and if the module proximate to said delay monitor is an active processor and when a processor serving as a stand-by processor is available, deactivates the processor as said proximate module and activates the processor serving as the stand-by processor.

12. The semiconductor device according to claim 1, wherein said semiconductor device includes processors, wherein a part of said processors can serve as a stand-by processor and parallel processing of programs can be carried out by two or more processors except for the stand-by processor, and said control unit, if having determined that said module suffers from aged deterioration, and when the module proximate to said delay monitor is an active processor and when a processor serving as a stand-by processor is not available, deactivates the processor as said proximate module.

13. The semiconductor device according to claim 1, wherein the ring oscillator of said delay monitor continues to oscillate for a delay time measurement period and except for a predetermined number of cycles before and after said measurement period.

14. The semiconductor device according to claim 1, wherein said control unit determines if the module suffers from aged deterioration, based on a difference between a delay time measured at the current time by said delay monitor and a delay value measured previously by said delay monitor.

* * * * *